(12) United States Patent
Dietz et al.

(10) Patent No.: US 11,047,939 B2
(45) Date of Patent: Jun. 29, 2021

(54) MAGNETIC RESONANCE DEVICE, MAGNETIC RESONANCE SYSTEM AND ASSOCIATED OPERATING METHOD

(71) Applicant: Siemens Healthcare GmbH, Erlangen (DE)

(72) Inventors: Peter Dietz, Fuerth (DE); Annette Stein, Spardorf (DE); Andreas Krug, Fuerth (DE); Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 21 days.

(21) Appl. No.: 16/529,049

(22) Filed: Aug. 1, 2019

(65) Prior Publication Data

US 2020/0041589 A1 Feb. 6, 2020

(30) Foreign Application Priority Data

Aug. 1, 2018 (DE) .......................... 102018212858.8

(51) Int. Cl.
| | |
|---|---|
| *G01V 3/00* | (2006.01) |
| *G01R 33/385* | (2006.01) |
| *G01R 33/28* | (2006.01) |
| *G01R 33/565* | (2006.01) |
| *G01K 1/14* | (2021.01) |
| *G01H 11/08* | (2006.01) |

(52) U.S. Cl.
CPC .......... *G01R 33/385* (2013.01); *G01H 11/08* (2013.01); *G01K 1/14* (2013.01); *G01R 33/288* (2013.01); *G01R 33/56572* (2013.01)

(58) Field of Classification Search
CPC .............. G01R 33/543; G01R 33/5659; G01R 33/3415; G01R 33/36; A61B 5/055
USPC .......................................................... 324/309
See application file for complete search history.

(56) References Cited

U.S. PATENT DOCUMENTS

| | | | | |
|---|---|---|---|---|
| 5,152,288 | A * | 10/1992 | Hoenig .................. | G01R 33/00 324/248 |
| 5,617,026 | A | 4/1997 | Yoshino et al. | |
| 2002/0079895 | A1* | 6/2002 | Roozen ............... | G01R 33/3854 324/318 |
| 2006/0057007 | A1* | 3/2006 | Bumbel ................ | F04D 29/662 417/423.15 |

(Continued)

FOREIGN PATENT DOCUMENTS

| | | |
|---|---|---|
| DE | 4432747 A1 | 3/1995 |
| DE | 102004019592 A1 | 9/2005 |

(Continued)

OTHER PUBLICATIONS

JP_408038442_A (Year: 1996).*
German Office Action dated Jul. 2, 2019, for Application No. 10 2018 212 858.8.

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

A magnetic resonance device comprising a gradient coil assembly having gradient coils is described. The gradient coils are supported by at least one cylindrical coil carrier for generating gradient fields. As part of the gradient coil assembly, at least one vibration sensor is provided for measuring vibrations of the gradient coil assembly at least in a radial direction of oscillation.

26 Claims, 3 Drawing Sheets

(56) References Cited

U.S. PATENT DOCUMENTS

Figure 1:
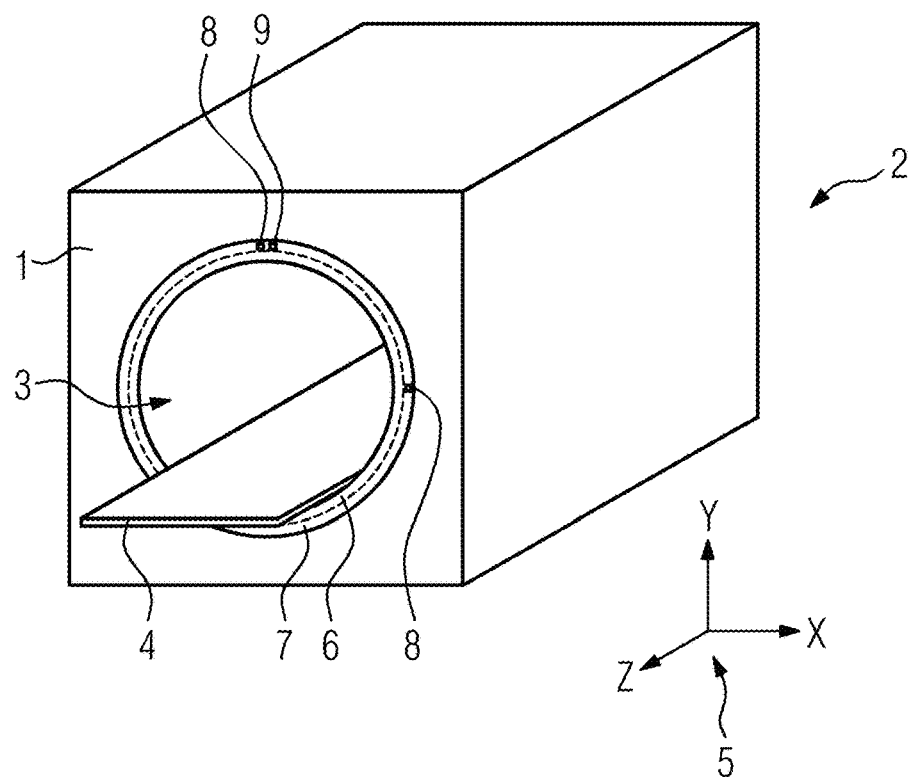

| | | | |
|---|---|---|---|
| 2007/0159169 A1* | 7/2007 | Sellers | G01R 33/3854 |
| | | | 324/318 |
| 2009/0024336 A1* | 1/2009 | Tatom | G01G 19/022 |
| | | | 702/56 |
| 2009/0071248 A1* | 3/2009 | Sakaguchi | G01P 15/18 |
| | | | 73/514.33 |
| 2010/0282076 A1* | 11/2010 | Fox | F24F 3/0442 |
| | | | 95/25 |
| 2011/0102178 A1* | 5/2011 | Kalo | G08B 13/122 |
| | | | 340/541 |
| 2011/0163857 A1* | 7/2011 | August | G06K 19/0723 |
| | | | 340/10.42 |
| 2013/0154642 A1* | 6/2013 | Sueoka | G01R 33/34015 |
| | | | 324/309 |
| 2014/0104725 A1* | 4/2014 | Massarotti | G11B 19/042 |
| | | | 360/97.19 |
| 2015/0051498 A1* | 2/2015 | Darty | G16H 50/50 |
| | | | 600/477 |
| 2015/0241540 A1 | 8/2015 | Vemickel et al. | |
| 2019/0053777 A1 | 2/2019 | Popescu | |

FOREIGN PATENT DOCUMENTS

| | | | | |
|---|---|---|---|---|
| DE | 60133769 T2 | 5/2009 | | |
| DE | 102013001250 A1 | 8/2014 | | |
| EP | 2895875 A1 | 7/2015 | | |
| JP | 408038442 A | * | 2/1996 | G01R 33/385 |

* cited by examiner

MAGNETIC RESONANCE DEVICE, MAGNETIC RESONANCE SYSTEM AND ASSOCIATED OPERATING METHOD

CROSS-REFERENCE TO RELATED APPLICATIONS

The present application claims the benefit of the filing date of German patent application no. DE 10 2018 212 858.8, filed on Aug. 1, 2018, the contents of which are incorporated herein by reference in their entirety.

TECHNICAL FIELD

The disclosure relates to a magnetic resonance device comprising a gradient coil assembly having gradient coils, which are supported by at least one cylindrical coil carrier, for generating gradient fields. The disclosure also relates to a magnetic resonance system comprising said magnetic resonance device, and to a method for operating a magnetic resonance device or a magnetic resonance system.

BACKGROUND

Magnetic resonance imaging has become an established imaging means in the medical sector. A (usually superconducting) main field magnet is typically used in a standard magnetic resonance device to generate a main magnetic field (BO field). Most magnetic resonance devices implement a main-field-magnet unit for said main field magnet, which forms a cylindrical patient placement area. In order to encode directions, it is known to use a gradient coil assembly having a plurality of gradient coils, usually three gradient coils, which can generate the gradient fields in three mutually-orthogonal main directions. A radiofrequency coil assembly is used to emit excitation pulses and to receive magnetic resonance signals, which are converted into associated magnetic resonance data.

In image acquisition operation, gradient coils are operated using high currents, which produce mechanical and electromagnetic effects inside the main magnetic field. In particular, loud noises are often produced in the magnetic resonance device during operation of the gradient coil assembly. The vibrations of the gradient coil assembly itself can in turn produce electromagnetic effects. In general, although currents flowing through the gradient coils generate a desired gradient field, they are also associated with Lorentz forces and ohmic heat.

SUMMARY

It has been proposed to equip gradient coil assemblies with temperature sensors, the sensor data from which represents the heat generation. These temperature sensors are fitted in the gradient coil assembly usually for the purpose of monitoring the maximum temperatures as component protection. It has subsequently been proposed, however, to use sensor data from the temperature sensors also in the sense of "preventive maintenance" and/or to increase image quality. For instance, increasing the image quality can be implemented by a BO-drift correction based on the sensor data from the temperature sensors. In addition, sensor data from the temperature sensors presents the opportunity of increasing power temporarily on the basis of account models.

Additional sensors used with regard to the gradient coils of the gradient coil assembly include current sensors, which detect currents flowing through the gradient coils. Such current sensors are usually fitted in the gradient amplifier and are used for monitoring.

In addition, it has been proposed to arrange other sensor types for specific analysis purposes temporarily on a gradient coil, for instance vibration sensors, or else to use other sensor types in the area immediately around a gradient coil. For example, microphones may be used for measuring the generated noise, pickup coils for measuring B-fields, and radiofrequency receiving coils for spike detection.

The subsequently published European patent application with application Ser. No. 17/191,898.0 has proposed integrating, in particular encapsulating, sensor platforms fully in a gradient coil, with these sensors also being able to measure a vibration amplitude or an acceleration value. This document does not disclose in detail, however, the design of these sensors or the use of the data from these sensors.

Therefore, an object of the disclosure is to define a way of improving the operation of a magnetic resonance device by means of improved monitoring and analysis capabilities for a gradient coil assembly.

This object is achieved according to the embodiments by a magnetic resonance device, a magnetic resonance system, and a method for operating a magnetic resonance device and/or a magnetic resonance system, as claimed in the independent claims and described elsewhere herein. The dependent claims also contain advantageous embodiments.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 2:
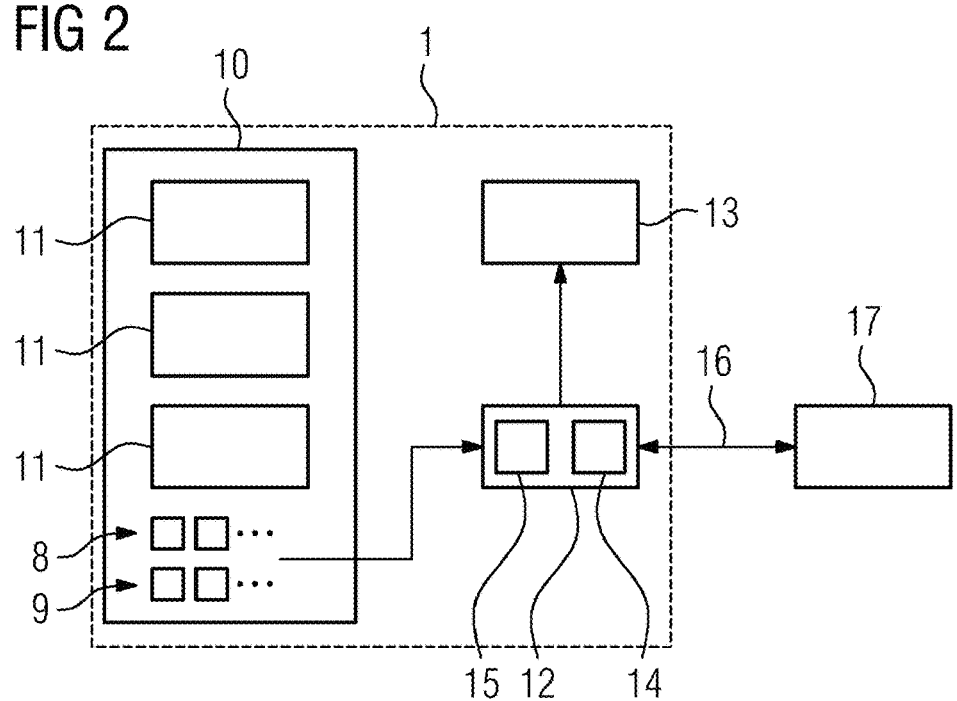
Figure 3:
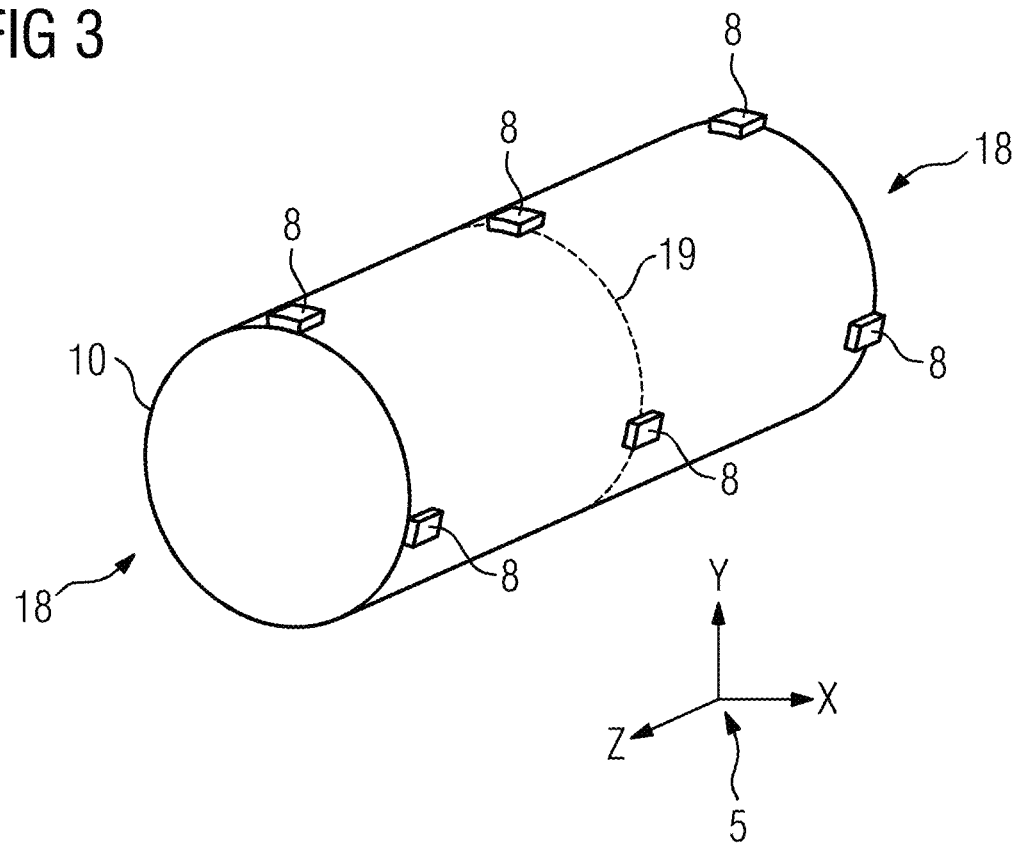
Figure 4:
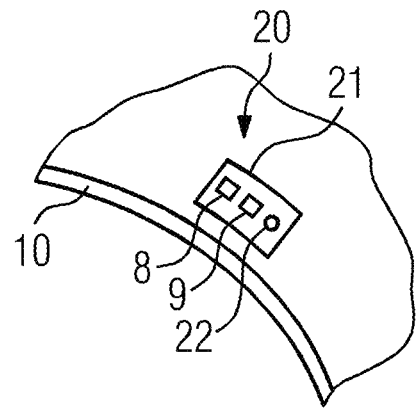
Figure 5:
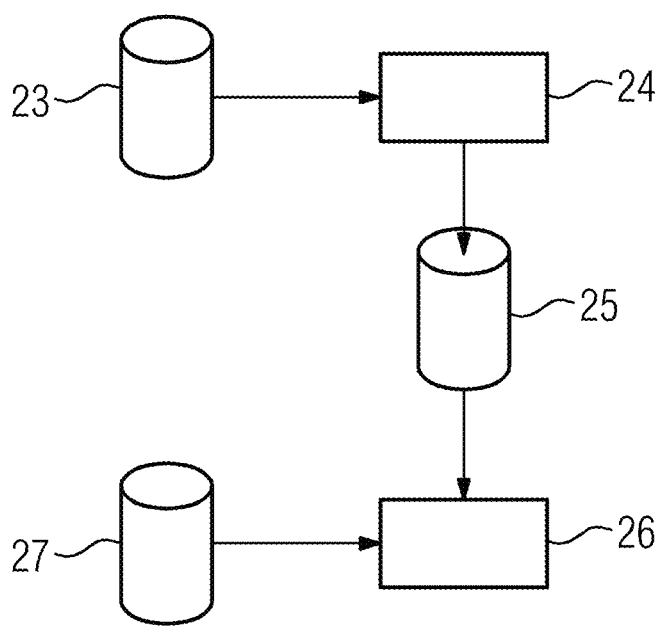

FIG. 1 shows a perspective view of a main magnet unit of a magnetic resonance device, in accordance with an embodiment of the present disclosure, FIG. 2 shows a block diagram of relevant components of a magnetic resonance device, in accordance with an embodiment of the present disclosure, FIG. 3 shows a perspective view of a coil body, in accordance with an embodiment of the present disclosure, FIG. 4 shows a detail showing mounting of sensors, in accordance with an embodiment of the present disclosure, and FIG. 5 shows a method flow, in accordance with an embodiment of the present disclosure, and The exemplary embodiments of the present disclosure will be described with reference to the accompanying drawings. The drawing in which an element first appears is typically indicated by the leftmost digit(s) in the corresponding reference number.

DETAILED DESCRIPTION

The embodiments described herein are directed to a magnetic resonance device that includes, as part of the gradient coil assembly, at least one vibration sensor for measuring vibrations of the gradient coil assembly at least in a radial direction of oscillation. The vibration sensor may be permanently installed in, or on, the gradient coil assembly.

In accordance with an embodiment of the disclosure, in addition to at least one temperature sensor, at least one vibration sensor as a permanently installed component of the gradient coil assembly, so that sensor data describing the oscillation behavior of the gradient coil assembly can be acquired by the at least one vibration sensor during operation of the gradient coil assembly. At least one of the at least one vibration sensors is designed and oriented to measure at least radial oscillations of the gradient coil assembly, such as of the coil carrier, for example. The permanent mounting of vibration sensors on a gradient coil assembly is suitable for recording sensor data that represents an attribute of the operation of the gradient coil assembly. This attribute has not been detected in conventional systems, and namely represents the Lorentz forces. It has been found that the radial oscillations are the most significant here, and therefore are measured with the highest priority, which the present disclosure also expresses by the appropriate design of at least one of the at least one vibration sensors. If the longitudinal direction of the patient placement area, and hence also of the cylindrical coil carrier, is designated the Z direction, then the measurement of vibrations of the gradient coil assembly, in particular of the coil carrier, hence relate at least to the X- and Y-directions, which are orthogonal thereto. As is generally known, a gradient coil of the gradient coil assembly can be assigned to each of these main directions.

The sensor data from the at least one vibration sensor can be analyzed both internal to and external to the magnetic resonance device, or any combination thereof. For example, the vibration sensor data may be analyzed jointly with sensor data from a likewise provided temperature sensor of the gradient coil assembly, so that information about the condition of the gradient coil assembly can be provided, and can be used in many different ways in the context of the present disclosure. For example, in this regard, embodiments of the present disclosure can be aimed at "big data" approaches and/or artificial intelligence approaches, to examine the additionally-obtained sensor data from the at least one vibration sensor for time characteristics and/or statistically-ascertainable correlations, and to be able to derive associated benefits therefrom.

For example, by comparing sensor data over time, although specifically under repeated use of a defined magnetic resonance sequence, for instance including a test sequence, it is possible to detect mechanical and/or dynamic changes in the gradient coil assembly, and to use this knowledge in particular to adjust the operation of the magnetic resonance device. It should be emphasized here that the sensor data from the at least one vibration sensor can be analyzed in any suitable manner, such as jointly, for instance, with sensor data from the temperature sensor, and also with regard to developing improved gradient coil assemblies.

In an embodiment of the present disclosure, a piezoelectric sensor and/or an accelerometer, e.g. in the form of a Micro-Electro-Mechanical System (MEMS), can be an implementation of at least one of the at least one vibration sensors. Accelerometers and piezoelectric sensors that are particularly suitable for use in magnetic resonance devices have already been proposed in this context, which therefore comprise few conductive components and avoid magnetic components as far as possible. In an embodiment, this means that the at least one vibration sensor can include as few conductive components as possible and no magnetic components.

To provide an illustrative example, embodiments include the piezoelectric sensor and/or the MEMS accelerometer being disposed in a region of low dynamic magnetic fields. Such dynamic magnetic fields of a magnetic resonance device comprise gradient fields and radiofrequency (RF) fields. Suitable regions of low dynamic magnetic fields may already be known from the design and/or construction of the magnetic resonance device and/or can be ascertained by means of measurements. Regions of low dynamic magnetic fields are thus those in which the amplitudes of the dynamic magnetic fields are lower than in other regions of the gradient coil assembly.

In another embodiment, strain gages and/or microphones can also be implemented as at least one of the at least one vibration sensors. In the case of strain gages, however, certain forms of vibration or oscillation cannot be detected by strain measurements, such as rigid-body movements that can arise with low-frequency excitations, and flexural oscillations when the strain gages are positioned at the freely suspended ends of the cylindrical coil body. Moreover, because microphones detect the sound emitted by the gradient coil assembly, an acoustic signal obtained in this manner as sensor data may also be mixed with information from the surroundings of the gradient coil assembly, for instance sound from eddy current sources and/or the acoustic air resonances of the resonant body surrounding the gradient coil assembly.

Embodiments include that at least one of the at least one vibration sensors is integrated, e.g. encapsulated, inside the coil body of the gradient coil assembly. This ensures excellent detection properties but does not allow subsequent access to the at least one vibration sensor, for example in the event of faults and/or other maintenance work.

Therefore, in an embodiment of the present disclosure, at least one of the at least one vibration sensors is mounted, in particular removably mounted in a non-permanent manner, on a surface of the gradient coil assembly. This can be done, for instance, by embedding at least one mounting means, such as a mounting plate comprising at least one screw thread, on a surface of the coil body of the gradient coil assembly, on which plate is mounted at least one of the at least one vibration sensors. In terms of easier replacement in the event of a fault, it is advantageous to position the at least one vibration sensor on the surface of the gradient coil assembly, so in particular of the coil body. Another advantage arising from positioning the at least one vibration sensor on the surface is that the vibration sensor can be attached after encapsulation of the gradient coils, and therefore need not be exposed to the high temperatures of the encapsulation process. Using a mounting plate, such as a base plate for example, containing a thread for subsequent mounting thereon of the vibration sensor guarantees stable and defined attachment.

In an embodiment of the present disclosure, it can be provided that, given freely mounted ends of the coil body, at least one of the at least one vibration sensors is positioned at least at one end of the coil body. As already mentioned, the gradient coil assembly is usually arranged to cylindrically surround the patient placement area, hence resulting in the longitudinal ends. Investigations have shown here that the coil body can essentially be assumed to be a freely-suspended body having free ends, because given the "free" boundary conditions at both ends, the maximum amplitudes of the vibrations, i.e. oscillations, can be expected at precisely these ends. As was already explained in this regard, it is specifically the radial vibrations that are of particular interest, because most effects are primarily defined by these motion components. It should be mentioned here that the ends also often correspond to regions of low dynamic magnetic fields.

If the at least one vibration sensor arranged at least at one end of the coil body is deemed to be "priority 1," then according to a development of the present disclosure, which can be understood to be "priority 2," for at least one vibration sensor provided at least at one end of the coil body, at least one additional vibration sensor is arranged in the center of the coil body, such as in an isocentral plane of the magnetic resonance device. Furthermore, in the case of oscillations, i.e. vibrations, more significant deflections are mostly present in the longitudinal region of the isocenter in the coil body, so that it is favorable to arrange in this region at least one additional vibration sensor, which detects these "submaxima."

With regard to specific types of analysis, however, it can also be favorable to detect in addition to the radial vibrations/oscillations, also those in the longitudinal direction of the coil body. According to a corresponding embodiment, which also can be designated "priority 3," at least one of the at least one vibration sensors arranged at least at one end, and/or an additional vibration sensor arranged at the end, is designed to measure oscillations of the gradient coil assembly made in the longitudinal direction. Whereas the measurement of radial vibration or oscillations is therefore based mainly on the essential meaning of "flexural oscillations," in the longitudinal direction it is also possible to detect what are known as "compressor modes," which can be equally relevant, for instance if the analysis is focused on stress on the coaxial connections of the gradient coil assembly.

The specific positioning with respect to the circumferential direction can depend on the number of vibration sensors actually used, such as at the ends for example. As already mentioned, the magnetic resonance device can comprise a cylindrical patient placement area, which is formed in a main magnet unit and is surrounded by the gradient coil assembly, wherein the three gradient coils are each assigned to one of three orthogonal main directions, of which one corresponds to the longitudinal direction of the patient placement area. This means that the gradient coils assigned to a main direction generate a gradient field having a gradient in this main direction. For example, the longitudinal direction of the patient placement area (and hence of the coil body supporting preferably all three gradient coils) can correspond to the Z direction as the main direction, where the other main directions are the X-direction and the Y-direction. Accordingly, the individual gradient coils of the gradient coil assembly can otherwise also be designated the X-gradient coil, Y-gradient coil, and Z-gradient coil.

When a single vibration sensor is implemented, or a single vibration sensor per, or for, the free ends of the coil body supporting all the gradient coils, is implemented, then according to an embodiment of the disclosure, the vibration sensor, or the vibration sensors, is/are arranged in the central plane between the planes formed by the longitudinal direction and the first additional main direction, and the longitudinal direction and the second main direction.

When a plurality of vibration sensors are implemented, at least one vibration sensor can be arranged in the plane formed from the longitudinal direction and the first additional main direction, and at least one additional vibration sensor can be arranged in the plane formed from the longitudinal direction and the second additional main direction. This means that the optimum positioning varies according to the number of vibration sensors used. The main vibrations of the X-gradient and of the Z-gradient can be expected for positions in the X-Z plane, and for the Y-gradient and Z-gradient in the Y-Z plane.

When one vibration sensor is available, a positioning on the 45° plane between the planes mentioned above can be selected, so that although the absolute maxima of the respective vibrations are not acquired, no crucial oscillation mode is undetected. In the case of a plurality of vibration sensors (e.g. per end), at least one vibration sensor can be arranged in the X-Z plane, and at least one additional vibration sensor in the Y-Z plane, to detect the absolute maxima as well.

It should be mentioned at this point that using a plurality of vibration sensors may be preferable using, for instance, a sensor array of vibration sensors, because by exploiting the usual gradient symmetries across the acquisition of amplitude relations and across the phase angles, it is also possible by means of analysis to obtain result data for reconstructing oscillation modes.

According to an embodiment of the disclosure, the at least one vibration sensor is designed to acquire sensor data describing an oscillation amplitude, an oscillation velocity, and/or an oscillation acceleration over time, and/or to acquire sensor data associated with a frequency of at least 2000 Hz and may include any suitable frequency range (e.g., up to and including 20000 Hz). A large amount of data on an oscillation can be extracted from such a vibration measurement, for instance amplitudes, harmonic components, phase angles, and/or time constants, in which case there should also be a sufficient temporal resolution. For example, vibration frequencies of up to 2000 Hz and a typically required resolution of 5 measurement points per half-wave result in a time frame of about 50 as, in which sensor data from the at least one vibration sensor can be acquired.

As already mentioned, according to a development of the present disclosure, the gradient coil assembly also comprises in addition to the at least one vibration sensor at least one temperature sensor for measuring a temperature of the gradient coil assembly. In many cases it makes sense as part of the analysis to consider jointly temperature effects and oscillation effects, i.e. effects of the Lorentz forces, to obtain a complete picture of the condition of the gradient coil assembly and the effects that it is causing.

The magnetic resonance device can thus comprise a control device, which is designed to analyze the sensor data from the at least one vibration sensor at least in part, e.g. at least in part jointly with sensor data from the at least one temperature sensor.

Alternatively or additionally, however, a magnetic resonance system can also be formed, which comprises at least one magnetic resonance device of the claimed type and an external control device, which is designed to analyze the sensor data from the at least one vibration sensor at least in part, e.g. at least in part jointly with sensor data from the at least one temperature sensor.

This means that sensor data from the at least one vibration sensor (and optionally also from the at least one temperature sensor) can be analyzed both locally at the magnetic resonance device itself and remotely by an external control device, for example a back-end device. In this case, the execution of analysis tasks can also be distributed, for instance, so that the control device based at the magnetic resonance device can perform analyses with regard to real-time compensation and/or reconstructive and/or post-processing corrections to magnetic resonance data, while the external control device can be responsible, for example, for the statistical analysis of sensor data over longer time periods, in particular in big-data approaches.

There are a large number of options for specific analyses of the sensor data from the at least one vibration sensor (and optionally from the at least one temperature sensor), and these options shall be presented in detail below. Generally speaking, the control device based at the magnetic resonance device and/or the external control device can be designed to analyze the sensor data as part of a modal analysis, for instance, for the purpose of determining at least one characteristic of at least one measured oscillation, such as determining, for example, one or more of a frequency, a frequency spectrum, harmonic information, amplitude information, a phase angle between two oscillation components, a time constant, and/or a spatial relationship value. Embodiments include the control device being configured to analyze the sensor data by means of, or for the purpose of, training at least one artificial intelligence algorithm related to at least one correlation, to monitor the safety of the magnetic resonance device on the basis of the sensor data, and/or to analyze the sensor data in order to adjust operating parameters, such as acquisition parameters for instance, of the magnetic resonance device. This may be performed, for example, for the purpose of performing one or more of compensating current, predicted effects of the gradient coil operation, for preventing the occurrence of previously measured effects of the gradient coil operation, and/or to initiate preventive maintenance on the basis of the sensor data, etc.

The disclosure accordingly also relates to a method for operating a magnetic resonance device of the claimed type or a magnetic resonance system of the claimed type, wherein a control device based at the magnetic resonance device and/or an external control device analyzes the sensor data from the at least one vibration sensor, optionally at least in part jointly with sensor data from the at least one temperature sensor. The statements regarding the magnetic resonance device according to the disclosure and respectively the magnetic resonance system according to the disclosure can be applied analogously to the method according to the disclosure, and therefore the aforementioned advantages can also be achieved by said method.

Therefore it can be provided that the control device based at the magnetic resonance device and/or the external control device analyze the sensor data, for example as part of a modal analysis, for the purpose of determining at least one characteristic of at least one measured oscillation, and/or by means of, or for the purpose of, training at least one artificial intelligence algorithm related to at least one correlation, and/or by means of statistical correlation techniques, and/or monitor the safety of magnetic resonance device on the basis of the sensor data, and/or analyze the sensor data to adjust operating parameters of the magnetic resonance device, and/or initiate preventive maintenance on the basis of the sensor data. On the other hand, it is also the case that the method-related aspects of the present disclosure that are discussed herein can be translated to corresponding embodiments of the respective control devices, which moreover can each comprise at least one processor and/or at least one storage means. Analysis aspects can be implemented here by hardware and/or software components or respective function units.

As already stated, analysis options for the sensor data include not only statistical approaches relating to longer time periods, such as big-data approaches for example, but also approaches relating to specific image acquisition processes, for instance compensating for effects in real time or correcting magnetic resonance data in reconstruction or post-processing. Results from a statistical correlation analysis or from an analysis using artificial intelligence can obviously in turn be used for live compensation and/or correction tasks. Specific examples shall be described below.

In an embodiment of the present disclosure, at least some of the sensor data is transferred to the external control device, collected over time, and analyzed statistically and/or using machine learning involving at least one artificial intelligence algorithm. Artificial intelligence may be implemented to establish correlations between data of different types, where, for example, "deep learning" techniques and/or other machine learning approaches can be used to train and hence parameterize an artificial intelligence algorithm that describes these correlations. For example, an artificial intelligence algorithm may be a neural network, such as a deep neural network, for example. Another suitable method is statistical correlation analysis. Not only in statistical analysis but also in machine learning, it can be provided that sensor data for a range of situations of identical operating conditions is processed jointly, so for instance operating parameters such as acquisition parameters that describe these operating conditions are recorded together with the sensor data. For example, identical or equivalent gradient pulses of magnetic resonance sequences can identify identical and/or equivalent magnetic resonance sequences and the like.

The analysis can be performed both with regard to mechanical effects and with regard to electromagnetic effects of the operation of the gradient coil assembly. In this context, mechanical effects describe the consequences of the aforementioned Lorentz forces, whereas electromagnetic effects may relate, for example, to the induction of eddy currents or the like. Both types of effects can be produced indirectly and/or by each other. For example, electromagnetic effects, for instance the induction of eddy currents in a vacuum enclosure of the main magnet, can give rise to local Lorentz forces and hence to mechanical effects. Similarly, vibrations of the gradient coil assembly, which are translated into vibrations of the gradient coils, in turn can also result in the occurrence of additional electromagnetic effects, for instance additional eddy currents. For many of the mechanical and electromagnetic effects, the temperature or temperature distribution of the gradient coil assembly, which advantageously is also taken into account, also plays a role.

It can be provided specifically that the analysis is performed to determine at least one assessment quantity describing a mechanical effect and/or an electromagnetic effect of the operation of the gradient coil assembly.

For example, at least one of the at least one assessment quantities can be used for real-time compensation of an associated effect by adjusting at least one operating parameter of the magnetic resonance device. On the one hand, this may relate to the imaging operation per se, for instance by adjusting pulse waveforms or the like, where an embodiment can relate to real-time noise suppression in a patient communication device with regards to sound produced at that moment by the gradient coil assembly and described by at least one of the at least one assessment quantities. Such a communication device, often called an intercom, allows communication between operating personnel and a patient under examination inside the patient placement area of the magnetic resonance device. For instance, commands relating to breathing or such like can be given via this device. It is important here that the patient also understands such communication attempts by the operating personnel, and vice versa, in which context the sound produced by the gradient coil assembly is particularly significant.

If the at least one vibration sensor measures instantaneous vibrations of the gradient coil assembly, it is possible to determine at least components of this sound and ultimately to perform compensation thereof in real-time, for which purpose various known approaches exist. It should be pointed out here that obviously also other sources of sound relating to the operation of the gradient coil assembly and described by the sensor data of the at least one vibration sensor (if applicable jointly with sensor data from the at least one temperature sensor) can be taken into account, such as a suitable algorithm including an artificial intelligence algorithm, has previously been trained or parameterized by analyzing sensor data. In this case, effects resulting from induction of eddy currents and accordingly produced Lorentz forces in an outer vacuum enclosure of a main magnet unit can be analyzed and subsequently taken into account, further details of which will be given below.

The sensor data available in real time can thus be used as an input for improving the communication quality, in particular by improved filtering-out of the gradient sound and/or by taking into account transient effects.

In another advantageous embodiment of the method according to the disclosure, it can be provided that at least one of the at least one assessment quantities is evaluated by at least one safety criterion, which describes a degradation in the fatigue strength of the gradient coil assembly itself or components surrounding same, and/or a current risk of damage for at least one component of the magnetic resonance device, and/or a hazard to a person under examination, and on this criterion being met, the imaging operation of the magnetic resonance device is suspended. Since the sound made by the magnetic resonance device is derived from the oscillation of the gradient coil assembly, especially at resonance thereof and the large amplitudes arising during resonance, and said oscillation affects the fatigue strength of the parts surrounding the gradient coil assembly. The oscillation information in the sensor data from the at least one vibration sensor can also be used for safety monitoring, and then also for safety shutdown, of the magnetic resonance device. With regards the component damage, this may relate, for example, to components of the magnetic resonance device for which voltages are coupled-in as a result of vibrations of the gradient coil assembly, where shim coils, specifically third-order shim coils, can be cited as an example. Thus power electronic components, in particular amplifiers, are protected especially with regard to the coupling-in of voltages or voltage spikes. In addition to monitoring for damage to components of the magnetic resonance device, it is also possible to perform sound monitoring with regard to the patient. An emergency termination of the image acquisition operation can be performed, for instance, when the sound produced by the gradient coil assembly becomes too loud.

In an embodiment of the disclosure, it can be provided that from at least one assessment quantity determined from sensor data acquired during an image acquisition process using the magnetic resonance device, a correction to the acquired magnetic resonance data in response to artifacts, such as ghosting artifacts, produced by the gradient coil assembly, such as movement thereof, is determined and applied. Vibration-induced eddy currents can cause image quality impairments, for instance ghosting artifacts. Since the associated field oscillations can be traced directly back to the measured vibrations, and the sensor data preferably describes the intensity and phase angles of the vibration, the sensor data from the at least one vibration sensor can be used for correcting image artifacts, such as during post-processing of the magnetic resonance data.

A rule can be determined from sensor data acquired in the past, which associates a resonant frequency of the gradient coil assembly with at least some of the sensor data, such as with the temperature, where at least one stop frequency (e.g., a frequency stopband), which must not be used by at least one component of the magnetic resonance device, is determined according to a resonant frequency corresponding to the live sensor data (e.g., currently-acquired or real-time sensor data). A specific test sequence that samples the response of the gradient coil assembly to different test frequencies can be used here for recording sensor data that is meant to be analyzed for determining the rule. The sensor data from the at least one vibration sensor is analyzed for resonances of the gradient coil assembly, for instance to be able to produce a family of characteristics, a lookup table, and/or a parameterized assignment algorithm, from which stop frequencies are read out using live sensor data. Temperatures and/or temperature distributions of the gradient coil assembly, such as can be measured by the at least one temperature sensor, can also be included here, where the association of at least one resonant frequency with live sensor data can relate in particular to sensor data from the temperature sensor, because the temperature has proved significant. It should be mentioned that the resonant frequency, which can also be understood in the sense of an assessment quantity, may also equal the stop frequency and/or can be used directly to define a frequency stopband around the resonant frequency.

A related development can provide that the position of a patient to be scanned and/or the acquisition region of the patient and/or attributes of the patient can also be included in determining the rule. Hence a form of predictive vibration analysis can be performed in this manner, i.e. the oscillation behavior of the gradient coil assembly can be recorded together with the parameters describing the image acquisition process, for instance including the position of the patient couch, the patient weight, the patient height, the body/mass index of the patient, the position of the patient and/or the acquisition region (for instance abdomen, head, pelvis, legs, etc.), etc. Changes in the oscillation behavior can be learned on the basis of "data mining" and/or statistical models and/or machine learning. This makes it possible to calculate the oscillation behavior of the gradient coil assembly in advance and hence to optimize acquisition parameters to prevent instantaneous mechanical resonances by means of suitable stop frequencies and/or frequency stopbands.

It can thus be stated generally that resonant phenomena can be learned from the acquisition of sensor data from the at least one vibration sensor, such as the dependency of said phenomena on temperature, and hence can be used to avoid, for example, sound spikes by adapting stop frequencies to the current condition of the gradient coil assembly, and for similar purposes.

Another advantageous embodiment of the present disclosure can provide that, in addition to sensor data obtained over the operating life and describing changes in the oscillation behavior of the gradient coil assembly, condition information is determined, which information is obtained by dismantling the gradient coil assembly at the end of the operating life, where a correlation between the variation in the oscillation behavior and the condition information is determined from datasets relating to a plurality of gradient coil assemblies and is used to predict an operating life of a gradient coil assembly currently in use from live sensor data describing the oscillation behavior of said gradient coil assembly.

It can be specifically provided here that notification of preventive maintenance is generated when a time interval before the pre-calculated end of operating life is reached. It is therefore possible to observe whether specific aging effects and damage can be inferred from a change in the oscillation behavior over the lifetime of the gradient coil assembly, and hence upon observing a similar change in the oscillation behavior in a gradient coil assembly of identical construction, an end of the operating life of the gradient coil assembly can be predicted, for instance so that preventive maintenance can be scheduled, in which the gradient coil assembly is replaced/repaired in good time and hence downtimes can be prevented pre-emptively. For example, delamination effects can hence be investigated, and it can be learned what type of delamination results in what modified oscillation behavior of the gradient coil assembly. To do this, sensor data is therefore also retained until the gradient coil assembly has reached the end of its lifetime and can be investigated accordingly. An examination of this type may form part of a recycling process ("coil salvage"), for example.

A development of the present disclosure can correlate the sensor data, which describes the oscillation behavior of the gradient coil assembly during an image acquisition process and has associated acquisition parameters, with artifact data describing image artifacts in the resultant magnetic resonance data, such as ghosting artifacts, from which is determined constraint information. In an embodiment, the constraint information may bound the range of selectable acquisition parameters and/or acquisition parameter combinations, which may then be applied to the magnetic resonance device. Such a procedure can also be designated "preventive image quality assurance." The oscillation behavior of the gradient coil assembly may be recorded jointly with resultant image artifacts, such as ghosting artifacts, for example. Machine learning and/or "data mining" and/or statistical correlation methods can be applied to identify which acquisition parameters, such as which sequence parameters such as repetition time, echo time, and the like, result in stronger artifacts, to prevent these in the future.

Another form of analyzing the sensor data is given when sensor data describing the oscillation behavior is correlated with sensor data describing the temperature characteristics to parameterize an oscillation prediction algorithm, which predicts from an initial temperature or temperature distribution in the gradient coil assembly, the oscillation behavior during an image acquisition process, where at least one operating parameter of the magnetic resonance device is adjusted as a result of the prediction. This adjustment can be made, for example, to increase the image quality and/or to prevent damage to at least one component of the magnetic resonance device and/or to avoid risks to the patient. The oscillation behavior of the gradient coil assembly is therefore recorded in this case jointly with simultaneous temperature measurement results in the gradient coil assembly. Machine learning and/or "data mining" and/or statistical correlation methods can be used to make predictions in future about the expected oscillation behavior depending on the initial temperature or the initial temperature distribution in the gradient coil assembly. Acquisition parameters or other operating parameters of the magnetic resonance device can hence be optimized already before the actual image acquisition process starts.

"Spikes" as they are known also constitute an effect on the operation of the gradient coil assembly that is relevant to the quality of image acquisition processes. "Spikes" are pulse-like in nature, covering a wide frequency band, are coupled to radiofrequency coils of the magnetic resonance device, and have frequency ranges that can also at least overlap the magnetic resonance frequency, or the range used for the magnetic resonance imaging, and hence can result in imaging interference, which can be manifested in corresponding image artifacts, for example. More detailed analyses into how such spikes caused by the gradient coil assembly arise still have not been carried out as yet. The present disclosure can also be employed favorably in this case by analyzing sensor data from the at least one vibration sensor.

It can hence be provided that sensor data is correlated with spike data defining the time at which a spike occurs, where at least one future operating parameter of the magnetic resonance device is adjusted on the basis of the correlation result in order to prevent spikes. Again in this case, sensor data from the at least one temperature sensor, which sensor data describes the temperature of the gradient coil assembly, may likewise be taken into account as well. For example, "data mining" and/or machine learning and/or statistical correlation methods can be used to train a prediction model, so that operating parameters of the magnetic resonance device can be adjusted in future in order to prevent spikes.

In another development of the method according to the disclosure, it is provided that the magnetic resonance device comprises a cooling device for a main field magnet, which cooling device uses helium, wherein at least one characterizing parameter of the cooling device, in particular at least one temperature of the main field magnet and/or of the helium and/or of a vacuum enclosure, and/or a helium boil-off value and/or a helium loss value and/or a reserve cooling capacity, is correlated with the sensor data in order to determine a relationship, said relationship being used, for example in accordance with an account model to predict the cooling behavior of the cooling device and to adapt on the basis thereof at least one operating parameter of the cooling device.

This embodiment may be useful for what are known as low-helium cooling devices (low He), i.e. those cooling devices for a main magnet that aim to manage with the minimum possible helium as the cooling agent. In this context, this approach may also be known as "predictive boil-off analysis for low-He magnets." The oscillation behavior and optionally also the temperature profile of the gradient coil assembly is recorded jointly with measurements of the helium consumption and of the temperature change in the main magnet. Again in this case, a prediction model, for instance in the form of a suitable cooling-prediction artificial intelligence algorithm, can be trained on the basis of "data mining" and/or machine learning and/or statistical correlation methods, to be able to predict the expected helium boil-off, the reserve cooling capacity, the helium loss and such like. This can be advantageously employed, for instance, as part of an account model.

In addition, a gradient impulse response function can be recorded using a field camera along with sensor data, and by correlating this information, an impulse response prediction algorithm can be parameterized, where a field distortion occurring during an image acquisition process is predicted by the impulse response prediction algorithm, and partially compensated by adjusting acquisition parameters, and/or is used to correct magnetic resonance data. In this embodiment, which can also be called "predictive gradient pulse response analysis," the oscillation behavior and optionally also the temperature profile of the gradient coil assembly are recorded jointly with measurements of the gradient impulse response function (GIRS). Said gradient impulse response function can be recorded using a field camera, where suitable field cameras for magnetic resonance devices, which can be positioned in the homogeneity volume, for instance, are already generally known. This entire data is used to allow a statement about the expected changes in gradient impulse response functions, such as with regard to eddy current generation, and hence to adjust the image acquisition process accordingly and/or to perform an optimum correction in the image reconstruction, for example.

In a development relating to sound produced as an effect of operating the gradient coil assembly, provision is made for sound data for a vacuum enclosure of the magnetic resonance device, in which enclosure the gradient coil assembly induces eddy currents, to also be recorded in addition to the sensor data, wherein a sound prediction algorithm is parameterized by correlating the sensor data and the sound data according to the operation of the gradient coil assembly, which algorithm is used to predict a sound component of the vacuum enclosure even without detecting sound data. This is based on the observation that there are two main ways in which the sound interfering in particular with communication with the patient is produced during operation of the gradient coil assembly.

One of these main ways is the sound produced directly by the gradient coil assembly, which sound, and the compensation thereof on the basis of sensor data, has already been mentioned. The second way is indirect sound production, in which eddy currents are induced in other components, mainly in an outer vacuum enclosure of the main magnet, and cause sound to be produced there. This sound source can also be detected if, in addition to a vibration sensor on the gradient coil assembly, a microphone is also used at least temporarily in the vicinity of the associated vacuum enclosure. Classifying the sound under the two main ways can be learned by "data mining," machine learning and/or statistical correlation methods, optionally also on the basis of sequence attributes, i.e. acquisition parameters used. Then at a later time, a sound component can be estimated even without using such a microphone on the vacuum enclosure. For instance, this sound component can then also be included in compensation for a communication device.

It should also be mentioned that it can also be appropriate for at least some of the analysis procedures described to use sensor data (and corresponding associated data/information) from a plurality of magnetic resonance devices, such as from a plurality of magnetic resonance devices in which at least the gradient coil assembly is of identical structural design. This enlarges further the database for the described learning methods, be it machine learning from artificial intelligence and/or statistical correlation methods, and hence improves the quality. It is therefore advisable, not just because of the larger processing power that can be achieved, to perform such learning analysis procedures on the external control device, for example a back-end device, which receives data from a plurality of magnetic resonance devices.

The various analysis approaches and correlation approaches described here can also be combined, at least in part, for instance so that correlations can also be considered in combination, and such like.

Moreover, within the scope of the present disclosure, a computer program is also conceivable, which performs the steps of a method according to the disclosure when it is executed on a control device of a magnetic resonance device and/or on an external control device of a magnetic resonance system. Said computer program can be loaded directly into a memory of a corresponding control device, and can comprise program means to perform the steps of a method described herein when the computer program is executed in the control device. The computer program can be stored on an electronically readable data storage medium (e.g., a non-transitory computer readable medium) which therefore comprises electronically readable control information stored thereon that comprises at least one said computer program and is designed such that it performs a method described herein when the data storage medium is used in a control device based at a magnetic resonance device and/or in an external control device.

FIG. 1 shows a perspective view of a main magnet unit of a magnetic resonance device, in accordance with an embodiment of the present disclosure. As shown in FIG. 1, a main magnet unit 1 is shown that constitutes part of a magnetic resonance device 2. The main magnet unit 1 contains the main magnet, which is a superconducting main magnet in this case, and is enclosed by an inner and an outer vacuum enclosure (not shown here). The main magnet may be referred to as a magnetic resonance data acquisition scanner or simply as a scanner. Formed in the main magnet unit 1 is a cylindrical patient placement area 3, into which a patient under examination can be moved by means of a patient support 4. The longitudinal direction of the cylindrical patient placement area 3 forms the Z-direction in the present case; the additional main directions, which are orthogonal thereto and mutually orthogonal, are designated the X-direction and Y-direction, as indicated by the coordinate system 5.

Surrounding the patient placement area 3 are provided a radiofrequency coil assembly 6 and a gradient coil assembly 7, said gradient coil assembly 7 comprising vibration sensors 8 as one fixed component and temperature sensors 9 as another fixed component.

FIG. 2 shows a block diagram of relevant components of a magnetic resonance device, in accordance with an embodiment of the present disclosure. As can be seen in FIG. 2, the gradient coil assembly 7 includes a coil carrier 10, which in the present case is also cylindrical and supports three gradient coils 11, which are also shown merely schematically in FIG. 2. Each of the gradient coils 11 is assigned to one of the main directions, in the present case to the X-direction, the Y direction, and the Z-direction. In addition, the vibration sensors 8 and the temperature sensors 9 are arranged on, or in, the coil carrier 10.

The vibration sensors 8 and the temperature sensors 9 initially supply their sensor data to a control device 12 of the magnetic resonance device 1, which in addition to the image acquisition operation, can also control other components of the magnetic resonance device 1. A communication device 13 (e.g., an intercom) is specifically shown here, which is used for communication between a patient situated in the patient placement area 3 and operating personnel located outside the shielded cabin. The sensor data from the vibration sensors 8 (and if applicable also the sensor data from the temperature sensors 9) can be analyzed in the control device 12, for example, to perform real-time compensation of sound produced by the gradient coil assembly 7, or even to terminate the image acquisition operation if a safety criterion relating to sound spikes is met. Similar safety criteria can also be provided with regard to imminent damage to components of the magnetic resonance device. The control device 12 can also comprise a reconstruction unit 14 (in addition to other function units), which uses sensor data from the vibration sensors 8 and the temperature sensors 9 recorded during an image acquisition process to correct acquired magnetic resonance data. Finally, an adjustment unit 15 of the control device 12 is also shown for the magnetic resonance device 1, which unit can adjust acquisition parameters directly or indirectly on the basis of predictions by suitable prediction models/algorithms, for instance indirectly by determining stop frequencies or frequency stopbands.

The control device 12 may be implemented as any suitable number and/or type of processing circuitry, and communicates via a communication connection 16, which can include the Internet, for example, and also with an external control device 17, for instance a back-end device, which likewise can receive sensor data from the vibration sensors 8 and from the temperature sensors 9, and if applicable additional information, to carry out analyses, in particular after accumulating relatively large amounts of data ("data mining"), by machine learning and/or statistical correlation methods, which will be discussed in greater detail below.

With further reference to the external control device 17, the external control device 17 may, together with the magnetic resonance device 1, form a magnetic resonance system. In various embodiments, the control device 12 of the magnetic resonance device 1 and the external control device 17, which may be located external to the magnetic resonance device 1 and communicate with the control device 12, may perform identical functions as one another to perform data analysis or other suitable functions independently of one another. Embodiments also include the control device 12 and the external the control device 17 working in conjunction with one another and/or offloading tasks to one another, with each respective component performing various tasks such as executing algorithms, sensor data analysis, etc.

For example, one or more of the control device 12 and/or the external control device 17 may be configured to analyze sensor data acquired from the at least one vibration sensor and/or to analyze the sensor data acquired from the at least one temperature sensor, as discussed herein. The analysis of sensor data is but one example of functionality that may be performed by the external control device 17, and generally the external control device 17 may perform any function described herein with respect to the control device 12 or any other suitable component of the magnetic resonance device 1. As another example, the control device 12 and/or the external control device 17 to analyze the sensor data (e.g., as acquired form the vibration and/or temperature sensors) as part of a modal analysis to determine characteristics of at least one measured oscillation, which may include one or more of a frequency, a frequency spectrum, harmonic information, a phase angle between two oscillation components, a time constant, and/or a spatial relationship value, etc.

As a further example, the control device 12 and/or the external control device 17 may be configured to analyze the sensor data to perform one or more of training at least one artificial intelligence algorithm related to at least one correlation, monitoring the safety of the magnetic resonance device on the basis of the sensor data, analyzing the sensor data to adjust acquisition parameters of the magnetic resonance device to compensate for current and/or predicted effects of the gradient coil operation, preventing the occurrence of previously measured effects of the gradient coil operation, and/or initiating preventive maintenance, etc.

Piezoelectric sensors and/or acceleration sensors, in this example accelerometers in the form of MEMS, may be implemented as the vibration sensors 8. These do not have any magnetic parts and comprise a minimum number of electrical parts.

FIG. 3 shows a perspective view of a coil body, in accordance with an embodiment of the present disclosure. As shown in FIG. 3, the position of the vibration sensors 8 on the coil body 10 is illustrated in greater detail. The coil body 10 is assumed in this case to be freely suspended with "free/free" boundary conditions. This means that the strongest oscillation amplitudes, i.e. vibration amplitudes, are expected at the ends 18 of the coil body 10 in the longitudinal direction, i.e. the Z-direction. It also holds that, as a result of the assignment of the gradient coils 11 to the main directions, associated vibrations are expected both in the X-Z plane and in the Y-Z plane. Hence it is the case here that two vibration sensors 8 are provided at each of the ends 18, and each of these two sensors is arranged in one of these planes in order to measure these different oscillation directions in an accurate manner. Since significant vibration amplitudes are also expected in the center for a coil body 10 that is assumed to be freely suspended, two additional vibration sensors 8 are optionally arranged at the respective intersections of an isocentral plane 19 (only suggested here) with the X-Z plane and the Y-Z plane.

Since it is also assumed that the flexural oscillations are the main oscillations, in the present example the vibration sensors 8 in each case detect radial oscillation components, i.e. along the X-direction or the Y-direction for the vibration sensors arranged in the corresponding planes. This means, for example, that for vibration sensors 8 in the form of accelerometers, the accelerometers in the case of vibration sensors 8 arranged in the Y-Z plane are oriented to measure in the Y-direction, which is the radial direction there, and in the case of vibration sensors 8 arranged in the X-Z plane are oriented to measure in the X-direction, which forms the radial direction there.

Optionally, the vibration sensors 8 can additionally be designed or oriented at least in part to measure in the longitudinal direction (Z-direction) and/or additional vibration sensors 8 can be provided at least in part to be able to measure vibrations also in the Z-direction (compressor modes).

It is conceivable in principle to integrate the vibration sensors 8 (and also the temperature sensors 9) fully in the coil body 10, for instance to encapsulate therein. Optionally, however, the vibration sensors 8 and the temperature sensors 9, which are not shown in FIG. 3 for the sake of clarity, may be replaceably (e.g., removably) mounted on the surface of the coil body 10, as is shown by way of example in FIG. 4. FIG. 4 further shows as the mounting means 20 a mounting plate 21 embedded in the coil body 10, which plate comprises threaded holes 22 for mounting vibration sensors 8 and temperature sensors 9.

FIG. 5 shows a method flow, in accordance with an embodiment of the present disclosure. FIG. 5 explains again in greater detail the basic principles of the analysis according to the method according to the disclosure. There are essentially two analysis levels for sensor data, which are used so as to complement one another. In a first analysis level, sensor data 23 (and if applicable additional information), is transferred to the external control device 17, is collected there and undergoes a statistical analysis, such as means of machine learning for example (block 24). The outcome from such correlation analyses, which can consist of "data mining," machine learning and/or statistical correlation analyses, are performed via a parameterized assignment means (block 25), which may include for instance prediction models, trained artificial-intelligence prediction algorithms, assignment rules, correlations, correlation results, relationships and the like.

The outcome of these assignment means 25 are now in turn returned to the control device 12 based at the magnetic resonance device, where they can be used as part of the local analysis processes (block 26), which also take into account live sensor data 27 and additional information. Additional analysis processes, for example some processes for monitoring safety criteria, may also run inside the control device 12 without using the assignment means 25, however.

Specific examples of entire analysis processes and the like shall be explained in greater detail below with reference to examples.

For instance it can be provided specifically that sensor data from both from the vibration sensors 8 and from the temperature sensors 9 is recorded over the entire operating life of the gradient coil assembly 7, and additional information is obtained at the end of the operating life by dismantling the gradient coil assembly 7. Thus, changes in the oscillation behavior can be correlated with the condition information over a large number of such gradient coil assemblies 7. The described artificial intelligence methods (machine learning) and/or statistical correlation techniques can be used in this process, and also in many of the following examples, for instance to parameterize, i.e. train, an operating-life prediction algorithm, which describes the correlation that has been found. Said operating-life prediction algorithm can be used to predict operating lives for gradient coil assemblies 7 currently in use, so that when the operating-life end lies a predetermined time interval ahead, notification of preventive maintenance can be output and the gradient coil assembly 7 can be replaced ideally without prolonged downtimes.

In another analysis process, a correlation of the oscillation behavior of the gradient coil assembly 7 during an image acquisition process can be correlated with image artifacts that emerge in the resultant magnetic resonance data, described by artifact data, in which process (as also in other correlation processes) it is possible to take into account acquisition parameters, such as the magnetic resonance sequence used. Statistical correlation techniques and/or machine learning can be used to derive constraint information therefrom, which bounds the range of selectable acquisition parameters and/or acquisition parameter combinations, to prevent in future such image artifacts, which may include ghosting artifacts, for example.

In a further analysis process, which may be performed via the external control device 17, an assignment rule can be determined, if applicable in the form of an artificial-intelligence assignment algorithm, but also in the form of a family of characteristics and/or a lookup table, which preferably assigns a current temperature or temperature distribution of the gradient coil assembly 7. Stop frequencies or frequency stopbands, which are meant to be taken into account by operating parameters of the magnetic resonance device 2, can be updated dynamically according to these resonant frequencies. Advantageously, facilitated by the large amount of collected data, the correlations are also analyzed with regard to the position of a patient to be scanned, the acquisition region of the patient, and attributes of the patient, because these input parameters can also have an effect on resonant frequencies of the gradient coil assembly 7.

Another option for an assignment means 25, which can be parameterized or trained by machine learning and/or statistical correlation techniques, is an oscillation prediction algorithm, which directly correlates the oscillation behavior with the temperature characteristics. Such an oscillation prediction algorithm can predict from an initial temperature or temperature distribution in the gradient coil assembly 7, the oscillation behavior during an image acquisition process. This information can then in turn be used in the control device 12 for suitable adjustment of operating parameters of the magnetic resonance device already before the image acquisition process starts.

Another analysis process relates to the important issue of "spikes" potentially arising in the radiofrequency coils as a result of the operation of the gradient coil assembly 7, in other words radiofrequency pulses that have a large frequency bandwidth, which also includes the frequency range used for the magnetic resonance imaging, and hence can interfere with the measurement. If such spikes are recorded, a correlation can also be performed in this case with simultaneously recorded sensor data from the vibration sensors 8 and from the temperature sensors 9, which in turn is based on specific operating parameters of the magnetic resonance device. Such operating parameters that lead traceably to spikes can be avoided in future or at least adjusted preventively.

Another beneficial use of the sensor data, which can be acquired in large volumes during normal image acquisition operation and also describes vibrations of the gradient coil assembly 7, results in connection with a cooling device for the main magnet, since the oscillation behavior and the temperature profile of the gradient coil assembly 7 can also be correlated with the operating parameters of the cooling device that describe the cooling activity and the cooling-agent state. For instance, what are known as low-He cooling devices/magnets, measurements on the helium consumption and on the temperature change in the main magnet can be provided for correlation with sensor data to train a cooling-prediction algorithm using artificial intelligence, for example, which can make predictions relating to expected helium boil-off, reserve cooling capacity, helium loss and the like, be taken into account in an account model or the like.

Another conceivable approach relates to predicting gradient impulse response functions, which can be measured using a field camera in the patient placement area 3, in order also to perform a correlation and to correct distortions arising in the image reconstruction on the basis of a parameterized impulse response prediction algorithm.

It should be mentioned in conclusion that to collect additional sensor data and/or additional information, for example for the analysis processes in step 24, it is also possible to use other magnetic resonance devices having at least gradient coil assemblies 7 of identical design to enlarge the database.

Although the embodiments of the disclosure have been illustrated and described in detail using the preferred exemplary embodiment, the disclosure is not limited by the disclosed examples, and a person skilled in the art can derive other variations therefrom without departing from the scope of protection of the disclosure.

What is claimed is:

1. A magnetic resonance device, comprising:
   a gradient coil assembly including:
     gradient coils configured to generate gradient fields;
     at least one cylindrical coil body configured to support the gradient coils; and
     at least one vibration sensor configured to measure vibrations of the gradient coil assembly at least in a radial direction of oscillation, the at least one vibration sensor being disposed in, or on, the gradient coil assembly; and
   a control device configured to analyze sensor data acquired from the at least one vibration sensor,
   wherein the control device is configured to analyze the sensor data as part of a modal analysis to determine at least one characteristic of at least one measured oscillation including one or more of (i) a frequency, (ii) a frequency spectrum, (iii) harmonic information, (iv) a phase angle between two oscillation components, (v) a time constant, and (vi) a spatial relationship value, and wherein the control device is further configured to analyze the sensor data to perform at least one of (i) training at least one artificial intelligence algorithm related to at least one correlation, (ii) monitoring the safety of the magnetic resonance device on the basis of the sensor data, (iii) analyzing the sensor data to adjust acquisition parameters of the magnetic resonance device to compensate for current and/or predicted effects of the gradient coil operation, (iv) preventing the occurrence of previously measured effects of the gradient coil operation, and (v) initiating preventive maintenance.

2. The magnetic resonance system, comprising:

a magnetic resonance device having a gradient coil assembly including:

gradient coils configured to generate gradient fields;

at least one cylindrical coil body configured to support the gradient coils; and at least one vibration sensor configured to measure vibrations of the gradient coil assembly at least in a radial direction of oscillation, wherein the at least one vibration sensor is disposed in, or on, the gradient coil assembly; and an external control device that is external to the magnetic resonance device configured to analyze sensor data acquired from the at least one vibration sensor wherein the external control device is configured to analyze the sensor data as part of a modal analysis to determine at least one characteristic of at least one measured oscillation including one or more of (i) a frequency, (ii) a frequency spectrum, (iii) harmonic information, (iv) a phase angle between two oscillation components, (v) a time constant, and (vi) a spatial relationship value, and wherein the external control device is further configured to analyze the sensor data to perform at least one of (i) training at least one artificial intelligence algorithm related to at least one correlation, (ii) monitoring the safety of the magnetic resonance device on the basis of the sensor data, (iii) analyzing the sensor data to adjust acquisition parameters of the magnetic resonance device to compensate for current and/or predicted effects of the gradient coil operation, (iv) preventing the occurrence of previously measured effects of the gradient coil operation, and (v) initiating preventive maintenance.

3. A method for operating a magnetic resonance device, comprising:

providing a gradient coil assembly including (i) gradient coils for generating gradient fields, (ii) at least one cylindrical coil body configured to support the gradient coils, (iii) at least one vibration sensor configured to measure vibrations of the gradient coil assembly at least in a radial direction of oscillation, the at least one vibration sensor being disposed in, or on, the gradient coil assembly, and (iv) at least one temperature sensor configured to measure a temperature of the gradient coil assembly; and providing a control device to analyze (i) sensor data acquired from the at least one vibration sensor, and (ii) sensor data acquired from the at least one temperature sensor, to determine at least one assessment quantity describing a mechanical effect and/or an electromagnetic effect of the operation of the gradient coil assembly;

performing, via the control device, real-time compensation of an effect associated with the at least one assessment quantity to adjust at least one operating parameter of the magnetic resonance device;

performing, via the control device, real-time noise suppression in a patient communication device with respect to sound produced by the gradient coil assembly and described by the at least one assessment quantity;

evaluating, via the control device using at least one safety criterion that includes one or more of (i) a degradation in a fatigue strength of the gradient coil assembly or components associated with the gradient coil assembly, (ii) a current risk of damage for at least one component of the magnetic resonance device, and (iii) a hazard to a person under examination; and upon the at least one safety criterion being met, suspending an imaging operation of the magnetic resonance device.

4. The magnetic resonance device as claimed in claim 1, wherein at least one of the at least one vibration sensors includes a piezoelectric sensor and/or a Micro-Electro-Mechanical System (MEMS) accelerometer.

5. The magnetic resonance device as claimed in claim 4, wherein the piezoelectric sensor and/or the MEMS accelerometer are disposed in the gradient coil assembly in a region of low dynamic magnetic fields.

6. The magnetic resonance device as claimed in claim 1, wherein at least one of the at least one vibration sensors is encapsulated inside the at least one cylindrical coil body.

7. The magnetic resonance device as claimed in claim 1, wherein at least one of the at least one vibration sensors is removably mounted on a surface of the gradient coil assembly via a mounting means.

8. The magnetic resonance device as claimed in claim 7, wherein the at least one mounting means includes a mounting plate comprising at least one screw thread embedded on a surface of the at least one cylindrical coil body of the gradient coil assembly, and wherein at least one of the at least one vibration sensors is mounted to the mounting plate.

9. The magnetic resonance device as claimed in claim 1, wherein at least one of the at least one vibration sensors is positioned at least at one end of the at least one cylindrical coil body of the gradient coil assembly.

10. The magnetic resonance device as claimed in claim 1, further comprising:

a cylindrical patient placement area formed in a main magnet unit and surrounded by the gradient coil assembly, wherein the gradient coils include three gradient coils, each of the three gradient coils being respectively assigned to one of three orthogonal directions, and wherein a first of the three orthogonal directions corresponds to a longitudinal direction of the patient placement area.

11. The magnetic resonance device as claimed in claim 10, wherein, when the at least one vibration sensor includes one vibration sensor, the vibration sensor is arranged in a central plane between planes formed by the longitudinal direction of the patient placement area and a second one of the three orthogonal directions, and wherein, when the at least one vibration sensor includes at least two vibration sensors, a first one of the at least two vibration sensors is arranged in a central plane between planes formed by the longitudinal direction of the patient placement area and a second one of the three orthogonal directions, and a second one of the at least two vibration sensors is arranged in a central plane between planes formed by the longitudinal direction of the patient placement area and a third one of the three orthogonal directions.

12. The magnetic resonance device as claimed in claim 1, wherein the at least one vibration sensor is configured to acquire sensor data describing at least one of (i) an oscillation amplitude, (ii) an oscillation velocity, or (iii) an oscillation acceleration over time, and/or to acquire sensor data associated with a frequency of at least 2000 Hz.

13. The magnetic resonance device as claimed in claim 1, wherein the gradient coil assembly further includes at least one temperature sensor configured to measure a temperature of the gradient coil assembly.

14. The magnetic resonance device as claimed in claim 13,
wherein the control device is further configured to analyze sensor data acquired from the at least one temperature sensor.

15. The magnetic resonance system of claim 2, wherein the gradient coil assembly further includes at least one temperature sensor configured to measure a temperature of the gradient coil assembly, and
wherein the external control device is further configured to analyze sensor data acquired from the at least one temperature sensor.

16. The method as claimed in claim 3, further comprising:
transferring at least some of the sensor data that is collected over time to an external control device; and
analyzing statistically and/or using machine learning, via the external control device, at least some of the sensor data via at least one artificial intelligence algorithm.

17. The method as claimed in claim 3, further comprising:
transferring at least some of the sensor data that is collected over time to an external control device; and
performing, via the external control device, real-time noise suppression in a patient communication device with respect to sound produced by the gradient coil assembly and described by the at least one assessment quantity.

18. The method as claimed in claim 3, further comprising:
correcting, via the control device using the at least one assessment quantity, acquired magnetic resonance data in response to ghosting artifacts produced by movement of the gradient coil assembly.

19. The method as claimed in claim 3, further comprising:
determining, via the control device, a rule using previously acquired sensor data, the rule associating a resonant frequency of the gradient coil assembly with at least some of the sensor data acquired via the temperature sensor; and
determining, via the control device, a frequency stopband that should not be used by at least one component of the magnetic resonance device according to a resonant frequency corresponding to currently-acquired sensor data.

20. The method as claimed in claim 3, further comprising:
wherein the sensor data acquired from at least one of the at least one vibration sensor and the at least one temperature sensor is obtained over an operating life of the magnetic resonance device and describes changes in oscillation behavior of the gradient coil assembly, and further comprising:
acquiring condition information via dismantling of the gradient coil assembly at the end of the operating life;
determining a correlation between a variation in the oscillation behavior and the condition information from datasets relating to a plurality of gradient coil assemblies; and
predicting an operating life of a different gradient coil assembly currently in use for which sensor data was not previously analyzed using currently-acquired sensor data associated with the different gradient coil assembly describing the oscillation behavior of said different gradient coil assembly.

21. The method as claimed in claim 3, wherein the sensor data acquired from one of the at least one vibration sensor and the at least one temperature sensor is obtained over an operating life of the magnetic resonance device and describes changes in oscillation behavior of the gradient coil assembly during an image acquisition process, and further comprising:
correlating the sensor data having associated acquisition parameters during the image acquisition process to artifact data describing ghosting artifacts in the resultant magnetic resonance data;
determining constraint information from the correlation of the sensor data to the artifact data, the constraint information defining bounds of a range of selectable acquisition parameters and/or acquisition parameter combinations; and
applying the range of selectable acquisition parameters and/or acquisition parameter combinations to the magnetic resonance device.

22. The method as claimed in claim 3, wherein sensor data acquired from the at least one vibration sensor describing the oscillation behavior is correlated with sensor data acquired from the at least one temperature sensor describing the temperature characteristics to parameterize an oscillation prediction algorithm, and further comprising:
predicting, in accordance with the oscillation prediction algorithm from an initial temperature or temperature distribution in the gradient coil assembly, the oscillation behavior during an image acquisition process; and
adjusting at least one operating parameter of the magnetic resonance device as a result of the prediction.

23. The method as claimed in claim 3, wherein the sensor data acquired from one of the at least one vibration sensor and the at least one temperature sensor is correlated with spike data defining a time at which a spike occurs, and further comprising:
adjusting at least one future operating parameter of the magnetic resonance device on the basis of the correlation result to prevent spikes.

24. The method as claimed in claim 3, wherein the magnetic resonance device comprises a cooling device for a main field magnet, the cooling device using helium, and further comprising:
correlating at least one characterizing parameter of the cooling device including at least one of (i) a temperature of the main field magnet, (ii) a temperature of the helium, (iii) a helium boil-off value, (iv) a helium loss value, and (v) a reserve cooling capacity, with the sensor data acquired from one of the at least one vibration sensor and the at least one temperature sensor to determine a relationship;
predicting, using the relationship in an account model, cooling behavior of the cooling device; and
adapting least one operating parameter of the cooling device based upon the prediction of the cooling behavior.

25. The method as claimed in claim 3, further comprising:
- recording a gradient impulse response function using a field camera with the sensor data acquired from one of the at least one vibration sensor and the at least one temperature sensor;
- correlating the gradient impulse response function with the sensor data to parametrize a response prediction algorithm;
- predicting a field distortion occurring during an image acquisition process via the impulse response prediction algorithm; and
- using the impulse response prediction algorithm to at least partially compensate for the predicted field distortion by adjusting acquisition parameters and/or to correct magnetic resonance data.

26. The method as claimed in claim 3, wherein the sensor data acquired from one of the at least one vibration sensor and the at least one temperature sensor includes recorded sound data for a vacuum enclosure of the magnetic resonance device in which enclosure the gradient coil assembly induces eddy currents, and further comprising:
- correlating the sensor data and the sound data according to the operation of the gradient coil assembly to parameterize a sound prediction algorithm; and
- predicting a sound component of the vacuum enclosure without detecting sound data using the sound prediction algorithm.

\* \* \* \* \*